(12) United States Patent
Wang

(10) Patent No.: US 6,627,946 B2
(45) Date of Patent: Sep. 30, 2003

(54) SEMICONDUCTOR MEMORY ARRAY OF FLOATING GATE MEMORY CELLS WITH CONTROL GATES PROTRUDING PORTIONS

(75) Inventor: Chih Hsin Wang, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 3 days.

(21) Appl. No.: 09/917,023

(22) Filed: Jul. 26, 2001

(65) Prior Publication Data

US 2002/0034847 A1 Mar. 21, 2002

Related U.S. Application Data

(60) Provisional application No. 60/234,314, filed on Sep. 20, 2000, provisional application No. 60/233,988, filed on Sep. 20, 2000, provisional application No. 60/242,096, filed on Oct. 19, 2000, provisional application No. 60/275,577, filed on Mar. 12, 2001, and provisional application No. 60/287,014, filed on Apr. 26, 2001.

(51) Int. Cl.[7] ............................................. H01L 29/788
(52) U.S. Cl. ....................... 257/316; 257/315; 257/320; 257/384; 257/385; 438/264; 438/267
(58) Field of Search ................................. 257/316, 315, 257/320, 384, 385; 438/264, 267

(56) References Cited

U.S. PATENT DOCUMENTS

| 4,757,360 A | 7/1988 | Faraone |
| 4,794,565 A | 12/1988 | Wu et al. |
| 4,882,707 A | 11/1989 | Mizutani |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |
| 5,101,250 A | 3/1992 | Arima et al. |
| 5,268,319 A | 12/1993 | Harari |
| 5,429,965 A | 7/1995 | Shimoji |
| 5,544,103 A | 8/1996 | Lambertson |
| 5,572,054 A | 11/1996 | Wang et al. |
| 5,780,341 A | 7/1998 | Ogura |
| 5,780,892 A | 7/1998 | Chen |
| 5,789,293 A | 8/1998 | Cho et al. |
| 5,796,139 A | 8/1998 | Fukase |
| 5,808,328 A | 9/1998 | Nishizawa |
| 5,811,853 A | 9/1998 | Wang |
| 5,814,853 A | 9/1998 | Chen |
| 6,091,104 A | 7/2000 | Chen |
| 6,103,573 A | 8/2000 | Harari et al. |
| 6,140,182 A | 10/2000 | Chen |
| 6,222,227 B1 | 4/2001 | Chen |

FOREIGN PATENT DOCUMENTS

EP  0 389 721 A2  10/1990

OTHER PUBLICATIONS

U.S. patent application Ser. No. 09/401,622, Johnson, filed Sep. 22, 1999.

*Primary Examiner*—Long Pham
(74) *Attorney, Agent, or Firm*—Gray Cary Ware & Freidenrich LLP

(57) ABSTRACT

A self aligned method of forming a semiconductor memory array of floating gate memory cells in a semiconductor substrate having a plurality of spaced apart isolation regions and active regions on the substrate substantially parallel to one another in the column direction. Floating gates are formed in each of the active regions. In the row direction, trenches are formed that include indentations. The trenches are filled with a conducting material to form blocks of the conducting material that constitute control gates. The trench indentations result in the formation of protruding portions on the control gates that extend over the floating gates.

4 Claims, 13 Drawing Sheets

SEMICONDUCTOR MEMORY ARRAY OF FLOATING GATE MEMORY CELLS WITH CONTROL GATES PROTRUDING PORTIONS

PRIORITY

This application claims the benefit of U.S. Provisional Application No. 60/234,314, filed Sep. 20, 2000, and entitled Super Self-Aligned Flash EEPROM Cell, and U.S. Provisional Application No. 60/233,988, filed Sep. 20, 2000, and entitled Super Self-Aligned Flash EEPROM Cell, and U.S. Provisional Application No. 60/242,096, filed Oct. 19, 2000, and entitled Ultra Self-Aligned Flash EEPROM Cell With SAC, U.S. Provisional Application No. 60/275,517, filed Mar. 12, 2001, and entitled Super Self-Aligned Flash E2PROM Cell, and U.S. Provisional Application No. 60/287,047, filed Apr. 26, 2001, and entitled An Ultra Self-Aligned Flash E2PROM Cell With Low Source Resistance and High Source Coupling.

TECHNICAL FIELD

The present invention relates to a self-aligned method of forming a semiconductor memory array of floating gate memory cells of the split gate type. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type, or a combination thereof.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

In the split-gate architecture, the control-gate FET is known to play a major role in disturbing mirror cells, as well as affecting the programming injection efficiency for source-side-injection FLASH cells. A good process control on the Lcg (also called the WL (word-line) poly length, which is the length of the control or select gate that is disposed over the channel) can ensure a full turn-off of the control-gate device, and hence can effectively prevent any disturbance in a mirror cell during programming (program disturb). The present invention is a method to realize a self aligned FLASH cell with improved full turn-off of the control-gate device with better program disturb characteristics. The present invention is also such a device.

SUMMARY OF THE INVENTION

In the present invention, the WL (control/select gate) poly length is controlled by a photo lithography process, which provides excellent scalability and control over the WL poly length as compared to a WL poly formed by a spacer process. Since the tight control on the photo process is a by-product of logic technology, the present invention thus offers a better control on WL poly length, and hence a better suppression of program disturb in mirror cells. An additional advantage of the present invention is that it allows the formation of cells with different WL poly lengths on the same wafer.

The present invention also results in the formation of the WL poly having a substantially rectilinear shape or planar side wall portion, which makes it easier and more controllable to form the side wall spacer, and to address issues of WL-to-BL (Bit Line) & WL-to-source block shorts. Further, in the first embodiment of the present invention, the WL poly is defined by a WL trench rather than by a spacer etch. Thus, the memory cell is immune from WL—WL shorts due to isolation or trench oxide-to-active topography, and the WL poly has a flat surface which makes contact formation on the WL strap easier (no WL strap needed). The first embodiment further presents an advantage over prior art in that it enables to the option to perform "after development inspection" for critical dimension inspection, e.g. after the photo lithography definition of the WL dimension. If the control on the critical dimension WL is off target, the error can be detected and the wafer can be re-worked to correctly define this critical dimension.

The present invention is a self-aligned method of forming a semiconductor memory array of floating gate memory cells in a semiconductor substrate, where each memory cell has a floating gate, a first terminal, a second terminal with a channel region therebetween, and a control gate. The method includes the steps of:

a) forming a plurality of spaced apart isolation regions on the substrate which are substantially parallel to one another and extend in a first direction, with an active region between each pair of adjacent isolation regions, the active regions each comprising a first layer of insulation material on the semiconductor substrate and a first layer of conductive material on the first layer of insulation material;

b) forming a plurality of spaced apart first trenches across the active regions and isolation regions which are substantially parallel to one another and extend in a second direction that is substantially perpendicular to the first direction and exposing the first layer of the conductive material in each of the active regions, each of the first trenches having an upper portion and a lower portion wherein the upper portion has a greater width than that of the lower portion;

c) forming a second layer of insulation material in each of the active regions that is disposed adjacent to and over the first layer of conductive material;

d) filling each of the first trenches with a second conductive material to form blocks of the second conductive material, wherein for each of the blocks in each active region:
the block is adjacent to the second layer of insulation material and is insulated from the substrate, and
the block includes a protruding portion formed by the wider upper portion of the first trench that is disposed over the second layer of insulation material and the first layer of conductive material;

e) forming a plurality of first terminals in the substrate, wherein in each of the active regions each of the first terminals is adjacent to one of the blocks; and f) forming a plurality of second terminals in the substrate, wherein in each of the active regions each of the second terminals is spaced apart from the first terminals and is below the first layer of conductive material.

In another aspect of the present invention for the self-aligned method of forming a semiconductor memory array of floating gate memory cells in a semiconductor substrate, the method includes the steps of:

a) forming a plurality of spaced apart isolation regions on the substrate which are substantially parallel to one another and extend in a first direction, with an active region between each pair of adjacent isolation regions, the active regions each comprising a first layer of insulation material on the semiconductor substrate and a first layer of conductive material on the first layer of insulation material;

b) forming a plurality of spaced apart first trenches across the active regions and isolation regions which are substantially parallel to one another and extend in a second direction that is substantially perpendicular to the first direction and exposing the first layer of the conductive material in each of the active regions, each of the first trenches having a side wall with an indentation formed therein;

c) forming a second layer of insulation material in each of the active regions that is disposed adjacent to and over the first layer of conductive material;

d) filling each of the first trenches with a second conductive material to form blocks of the second conductive material, wherein for each of the blocks in each active region:
the block is adjacent to the second layer of insulation material and is insulated from the substrate, and
the block includes a protruding portion formed by the indentation in the first trench side wall that is disposed over the second layer of insulation material and the first layer of conductive material;

e) forming a plurality of first terminals in the substrate, wherein in each of the active regions each of the first terminals is adjacent to one of the blocks; and f) forming a plurality of second terminals in the substrate, wherein in each of the active regions each of the second terminals is spaced apart from the first terminals and is below the first layer of conductive material.

In yet another aspect of the present invention, an electrically programmable and erasable memory device includes a substrate of semiconductor material of a first conductivity type, first and second spaced-apart terminals in the substrate of a second conductivity type with a channel region therebetween, a first insulation layer disposed over said substrate, an electrically conductive floating gate disposed over said first insulation layer and extending over a portion of said channel region and over a portion of the second terminal, a second insulation layer disposed over and adjacent the floating gate and having a thickness permitting Fowler-Nordheim tunneling of charges therethrough, and an electrically conductive control gate having a first portion and a second portion, the first portion being substantially rectangularly shaped and positioned adjacent to the second insulation layer and the floating gate, the second portion being substantially rectangularly shaped and having a width that is greater than that of the first portion so that a portion of the second portion extends over a portion of the second insulation layer and a portion of the floating gate.

In yet one more aspect of the present invention, an array of electrically programmable and erasable memory devices includes a substrate of semiconductor material of a first conductivity type, and spaced apart isolation regions formed on the substrate which are substantially parallel to one another and extend in a first direction, with an active region between each pair of adjacent isolation regions. Each of the active regions includes a column of memory cells extending in the first direction, where each of the memory cells includes first and second spaced-apart regions formed in the substrate having a second conductivity type, with a channel region formed in the substrate therebetween, a first insulation layer disposed over said substrate including over said channel region, an electrically conductive floating gate disposed over said first insulation layer and extending over a portion of said channel region and over a portion of the second region, and a second insulation layer disposed over and adjacent the floating gate and having a thickness permitting Fowler-Nordheim tunneling of charges therethrough. A plurality of electrically conductive control gates each extend across the active regions and isolation regions in a second direction substantially perpendicular to the first direction and having a first portion that is substantially rectangular in shape and a second portion that is substantially rectangular in shape, the second portion having a width that is greater than that of the first portion, wherein each of the control gates intercepts one of the memory cells in each of the active regions such that the first portion is positioned adjacent to the second insulation layer and the floating gate therein and the second portion partially extends over the second insulation layer and the floating gate.

In yet one additional aspect of the present invention, an electrically programmable and erasable memory device includes a substrate of semiconductor material of a first conductivity type, first and second spaced-apart terminals in the substrate of a second conductivity type, with a channel region therebetween, a first insulation layer disposed over said substrate, an electrically conductive floating gate disposed over said first insulation layer and extending over a portion of said channel region and over a portion of the second terminal, a second insulation layer disposed over and adjacent the floating gate and having a thickness permitting Fowler-Nordheim tunneling of charges therethrough; and an electrically conductive control gate. The control gate includes a substantially planar side wall portion positioned adjacent to the second insulation layer and the floating gate, and a protruding portion that protrudes from the planar side wall portion to partially extend over the floating gate and is insulated therefrom.

In a further aspect of the present invention, an array of electrically programmable and erasable memory devices includes a substrate of semiconductor material of a first conductivity type, and spaced apart isolation regions formed on the substrate which are substantially parallel to one another and extend in a first direction, with an active region between each pair of adjacent isolation regions. Each of the active regions includes a column of memory cells extending in the first direction, where each of the memory cells includes first and second spaced-apart terminals formed in the substrate having a second conductivity type, with a channel region formed in the substrate therebetween, a first insulation layer disposed over said substrate including over said channel region, an electrically conductive floating gate disposed over said first insulation layer and extending over a portion of said channel region and over a portion of the second terminal, and a second insulation layer disposed over and adjacent the floating gate and having a thickness permitting Fowler-Nordheim tunneling of charges therethrough. A plurality of electrically conductive control gates each extend across the active regions and isolation regions in a second direction substantially perpendicular to the first direction. Each of the control gates includes a substantially planar side wall portion and a protruding portion that protrudes from the planar side wall portion, wherein each of the control gates intercepts one of the memory cells in each of the active regions such that the substantially planar side wall portion is positioned adjacent to the second insulation layer and the floating gate, and said protruding portion partially extends over the floating gate and is insulated therefrom.

Another aspect of the invention is a self-aligned method of forming a semiconductor memory array of floating gate memory cells in a semiconductor substrate, where each memory cell has a floating gate, a first terminal, a second terminal with a channel region therebetween, and a control gate. The method includes the steps of:

a) forming a plurality of spaced apart isolation regions on the substrate which are substantially parallel to one another and extend in a first direction, with an active region between each pair of adjacent isolation regions, the active regions each comprising a first layer of insulation material on the semiconductor substrate and a first layer of conductive material on the first layer of insulation material;

b) forming a plurality of spaced apart first trenches across the active regions and isolation regions which are substantially parallel to one another and extend in a second direction that is substantially perpendicular to the first direction and exposing the first layer of the conductive material in each of the active regions;

c) forming a second layer of insulation material in each of the active regions that is disposed adjacent to and over the first layer of conductive material;

d) forming first side wall spacers of a material on side walls of the first trenches;

e) forming a second side wall spacer of a material on each of the first side wall spacers;

f) forming second trenches in each of the active regions, wherein each of the second trenches have a side wall that is immediately adjacent to one of the first side wall spacers;

g) removing the first side wall spacers to form an indentation in each of the second trench side walls;

h) filling each of the second trenches with a second conductive material to form blocks of the second conductive material, wherein for each of the blocks in each active region:
   the block is adjacent to the second layer of insulation material and is insulated from the substrate, and
   the block includes a protruding portion formed by the second trench side wall indentation that is disposed over the second layer of insulation material and the first layer of conductive material;

i) forming a plurality of first terminals in the substrate, wherein in each of the active regions each of the first terminals is adjacent to one of the blocks; and j) forming a plurality of second terminals in the substrate, wherein in each of the active regions each of the second terminals is spaced apart from the first terminals and is below the first layer of conductive material.

One additional aspect of the present invention is a self-aligned method of forming a semiconductor memory array of floating gate memory cells in a semiconductor substrate, each memory cell having a floating gate, a first terminal, a second terminal with a channel region therebetween, and a control gate. The method includes the steps of:

a) forming a plurality of spaced apart isolation regions on the substrate which are substantially parallel to one another and extend in a first direction, with an active region between each pair of adjacent isolation regions;

b) forming a plurality of spaced apart first trenches across the active regions and isolation regions which are substantially parallel to one another and extend in a second direction that is substantially perpendicular to the first direction, and forming a first layer of conductive material in each of the active regions adjacent to the first trenches and disposed over a first layer of insulation material;

c) forming a second layer of insulation material in each of the active regions that is disposed adjacent to and over the first layer of conductive material;

d) forming first side wall spacers of a material on side walls of the first trenches;

e) forming a second side wall spacer of a material on each of the first side wall spacers;

f) forming second trenches in each of the active regions, wherein each of the second trenches have a side wall that is immediately adjacent to one of the first side wall spacers;

g) removing the first side wall spacers to form an indentation in each of the second trench side walls;

h) filling each of the second trenches with a second conductive material to form blocks of the second conductive material, wherein for each of the blocks in each active region:
   the block is adjacent to the second layer of insulation material and is insulated from the substrate, and
   the block includes a protruding portion formed by the second trench side wall indentation that is disposed over the second layer of insulation material and the first layer of conductive material;

i) forming a plurality of first terminals in the substrate, wherein in each of the active regions each of the first terminals is adjacent to one of the blocks; and j) forming a plurality of second terminals in the substrate, wherein in each of the active regions each of the second terminals is spaced apart from the first terminals and is below the first layer of conductive material.

Other objects and features of the present invention will become apparent by a review of the specification, claims and appended figures.

DETAILED DESCRIPTION OF THE PREFERRED EMBODIMENTS

Figure 1A:
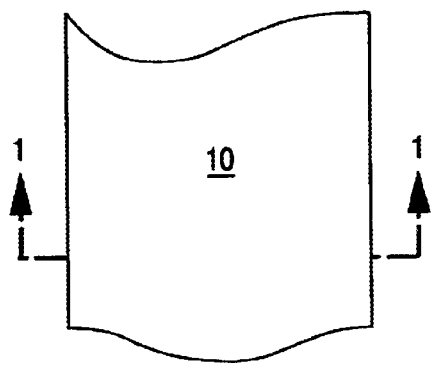
FIG. 1A is a top view of a semiconductor substrate used in the first step of the method of present invention to form isolation regions.
Figure 1B:
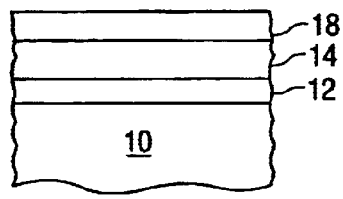
FIG. 1B is a cross sectional view taken along the line 1—1.

Referring to FIG. 1A there is shown a top plan view of a semiconductor substrate 10, which is preferably of P type and is well known in the art. A first layer of insulation material 12, such as silicon dioxide (oxide), is deposited thereon as shown in FIG. 1B. The first insulation layer 12 is formed on the substrate 10 by well known techniques such as oxidation or deposition (e.g. chemical vapor deposition or CVD), forming a layer of silicon dioxide (hereinafter "oxide"). A first layer of polysilicon 14 (FG poly) is deposited on top of the first layer of insulation material 12. The deposition and formation of the first polysilicon layer 14 on the first insulation layer 12 can be made by a well known process such as Low Pressure CVD or LPCVD. A silicon nitride layer 18 (hereinafter "nitride") is deposited over the polysilicon layer 14, preferably by CVD. This nitride layer 18 is used to define the active regions during isolation formation. Of course, all of the forgoing described parameters and the parameters described hereinafter, depend upon the design rules and the process technology generation. What is described herein is for the 0.18 micron process. However, it will be understood by those skilled in the art that the present invention is not limited to any specific process technology generation, nor to any specific value in any of the process parameters described hereinafter.

Figure 1C:
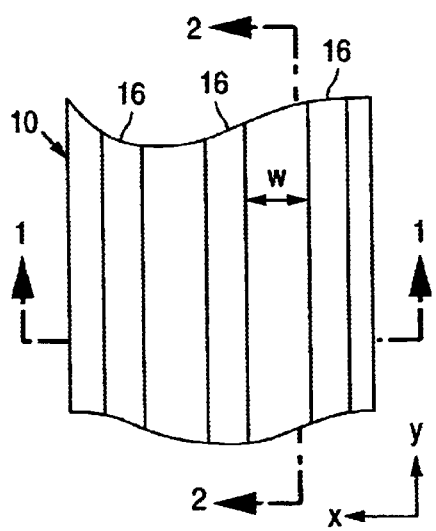
FIG. 1C is a top view of the next step in the processing of the structure of FIG. 1B, in which isolation regions are formed.
Figure 1D:
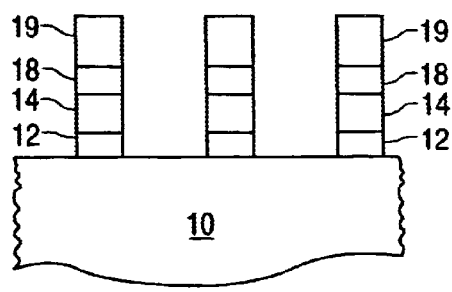
FIG. 1D is a cross sectional view of the structure in FIG. 1C taken along the line 1—1 showing the isolation stripes formed in the structure.

Once the first insulation layer 12, the first polysilicon layer 14, and the silicon nitride 18 have been formed, suitable photo-resistant material 19 is applied on the silicon nitride layer 18 and a masking step is performed to selectively remove the photo-resistant material from certain regions (stripes 16). Where the photo-resist material 19 is removed, the silicon nitride 18, the polysilicon 14 and the underlying insulation material 12 are etched away in stripes 16 formed in the Y direction or the column direction, as shown in FIG. 1C, using standard etching techniques (i.e. anisotropic etch process). The distance W between adjacent stripes 16 can be as small as the smallest lithographic feature of the process used. Where the photo resist 19 is not removed, the silicon nitride 18, the first polysilicon region 14 and the underlying insulation region 12 are maintained. The resulting structure is illustrated in FIG. 1D. As will be described, there are two embodiments in the formation of the isolation regions: LOCOS and STI. In the STI embodiment, the etching continues into the substrate 10 to a predetermined depth.

The structure is further processed to remove the remaining photo resist 19. Then, an isolation material 20a or 20b, such as silicon dioxide, is formed in the regions or "grooves" 16. The nitride layer 18 is then selectively removed to form the structure shown in FIG. 1E. The isolation can be formed via the well known LOCOS process resulting in the local field oxide 20a (e.g. by oxidizing the exposed substrate), or it can be formed via a shallow trench process (STI) resulting in silicon-dioxide being formed in the region 20b (e.g. by depositing an oxide layer, followed by a Chemical-Mechanical-Polishing or CMP etch). It should be noted that during the LOCOS formation, a spacer may be necessary to protect the side walls of poly layer 14 during the formation of the local field oxide.

Figure 1E:
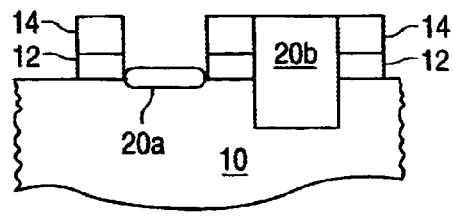
FIG. 1E is a cross sectional view of the structure in FIG. 1C taken along the line 1—1 showing the two types of isolation regions that can be formed in the semiconductor substrate: LOCOS or shallow trench.

The remaining first polysilicon layer 14 and the underlying first insulation material 12 form the active regions. Thus, at this point, the substrate 10 has alternating stripes of active regions and isolation regions with the isolation regions being formed of either LOCOS insulation material 20a or shallow trench insulation material 20b. Although FIG. 1E shows the formation of both a LOCOS region 20a and a shallow trench region 20b, only one of the LOCOS process (20a) or the shallow trench process (20b) will be used. In the preferred embodiment, the shallow trench 20b will be formed. Shallow trench 20b is preferable because it can be more precisely formed at smaller design rules.

The structure in FIG. 1E represents a self aligned structure, which is more compact than a structure formed by a non self-aligned method. A non self-aligned method of forming the structure shown in FIG. 1E, which is well known and is conventional, is as follows. Regions of isolation 20 are first formed in the substrate 10. This can be done by depositing a layer of silicon nitride on the substrate 10, depositing photo-resist, patterning the silicon nitride using a first masking step to expose selective portions of the substrate 10, and then oxidizing the exposed substrate 10 using either the LOCOS process or the STI process where silicon trench formation and trench fill are involved. Thereafter, the silicon nitride is removed, and a first layer of silicon dioxide 12 (to form the gate oxide) is deposited over the substrate 10. A first layer of polysilicon 14 is deposited over the gate oxide 12. The first layer of polysilicon 14 is then patterned using a second masking step and selective portions removed. Thus, the polysilicon 14 is not self aligned with the regions of isolation 20, and a second masking step is required. Further, the additional masking step requires that the dimensions of the polysilicon 14 have an alignment tolerance with respect to the regions of isolation 20. It should be noted that the non self-aligned method does not utilize nitride layer 18.

Figure 2A:
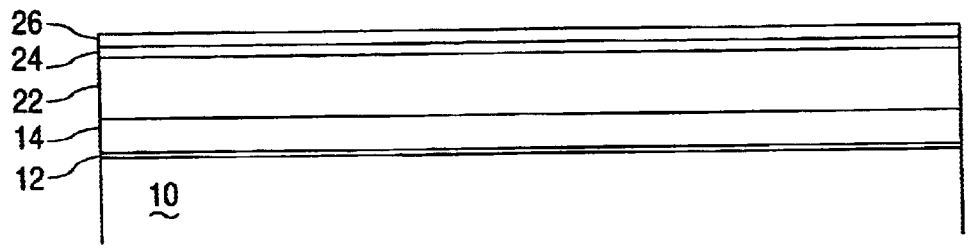
FIGS. 2A–2T are cross sectional views taken along the line 2—2 of FIG. 1C showing in sequence the next step(s) in the processing of the structure shown in FIG. 1C, in the formation of a non volatile memory array of floating memory cells of the split gate type.

With the structure shown in FIG. 1E made using either the self aligned method or the non self-aligned method, the structure is further processed as follows. Referring to FIG. 2A, which shows the structure from a view orthogonal to that of FIGS. 1B and 1E, the next steps in the process of the present invention are illustrated. A stack of insulation layers is formed on the structure. Specifically, a thick silicon oxide (hereinafter "oxide") layer 22 (is deposited across the entire surface of the structure, followed by the deposition of a silicon nitride (hereinafter "nitride") layer 24. A oxide layer 22 is approximately 2000–3000 A thick, and nitride layer 24 is approximately 200–400 A thick. A top oxide layer 26 approximately 800 A thick is then deposited onto nitride layer 24. However, the number of insulation layers in the stack of insulation layers need not necessarily be three as described above.

Figure 2B:
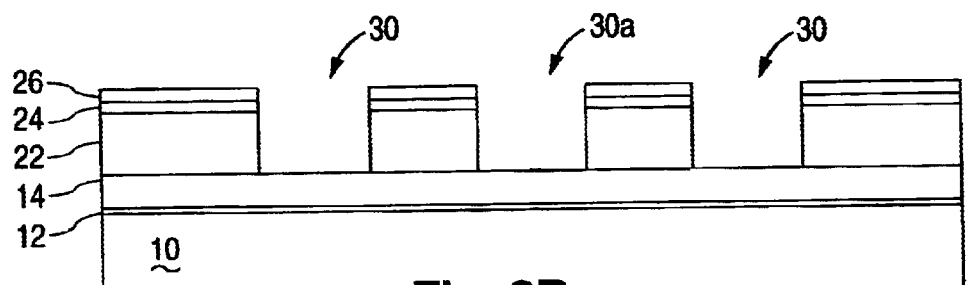
FIG. 2U is a top view showing the interconnection of row lines and bit lines to terminals in active regions in the formation of the non volatile memory array of floating memory cells of the split gate type.

A WL masking operation is performed with photo-resist applied on top of the oxide layer 26. A masking step is applied in which stripes (i.e. masking regions) are defined in the X or the row direction. The distance between adjacent stripes can be a size determined by the needs of the device to be fabricated. The photo resist is removed in defined masking regions, i.e. stripes in the row direction, after which well known etch processes are used to selectively remove layers 26, 24, and 22 underlying the removed photo resist in the stripes. Specifically, an oxide anisotropic etch process is used to remove the exposed portion of the oxide layer 26 until the nitride layer 24 is observed, which acts as an etch stop thereby stopping the etch process. Then, an anisotropic nitride etch step is performed to remove the exposed nitride layer 24 until the oxide layer 22 is observed, which acts as an etch stop. Then another oxide anisotropic etch process is used to remove the exposed portion of the oxide layer 22 until the polysilicon layer 14 is observed, which acts as an etch stop thereby stopping the etch process. It will become evident from the following description that the process of the present invention creates multiple pairs of mirror sets of memory cells. For each such pair of mirror memory cells, these four etch processes result in the formation of a pair of first trenches 30, with a single trench 30a therebetween, that extend down to polysilicon layer 14. The remaining photo-resist is then removed. The resulting structure for one such pair of mirror cells is illustrated in FIG. 2B.

Figure 2C:
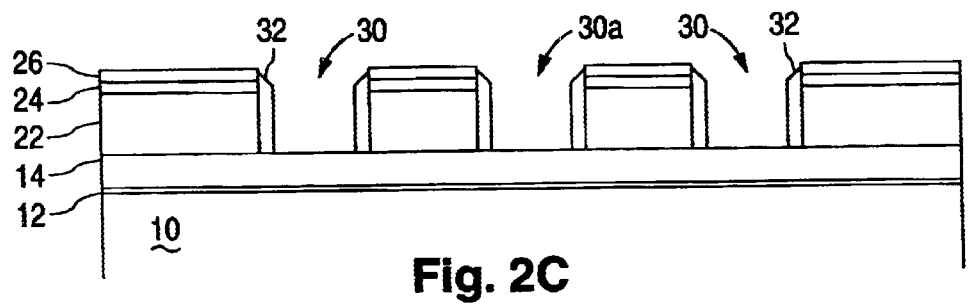

Insulation spacers 32 are then formed along the side wall surfaces of trenches 30 and 30a. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure. Spacers 32 can be formed of any dielectric material. In the structure illustrated in FIG. 2C, insulation spacers are formed of nitride by depositing a thin layer of nitride on exposed surfaces of the structure, followed by an anisotropic etch process, such as Reactive Ion Etch (RIE) which is well known in the art, which removes the deposited nitride except for spacers 32.

Figure 2D:
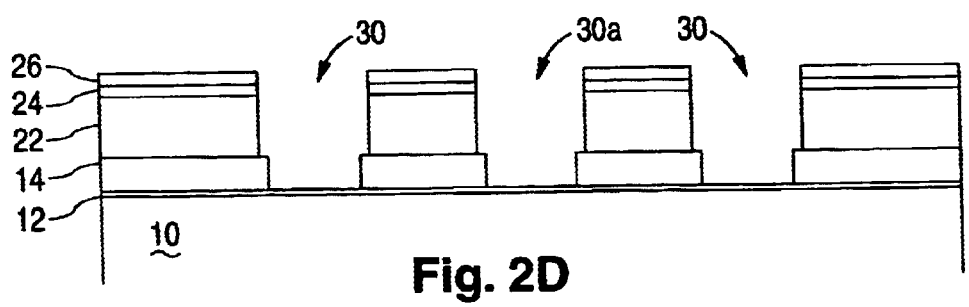

An anisotropic poly etch process is performed between the opposing insulation spacers 32 to remove the exposed poly layer 14 at the bottom of trenches 30 and 30a until the oxide layer 12 is observed, which acts as an etch stop. A nitride etch is then used to remove nitride spacers 32. The use of spacers 32 allows the formation of first trenches 30 and 30a having a width at the poly layer 14 that is less than the width of the masking step used to initially define the tops of first trenches 30. Thus, this process can be referred to as a sub-litho process. Trenches 30 and 30a each have a narrower width at a lower portion thereof adjacent the poly layer 14 relative to a wider width at an upper portion thereof adjacent the oxide/nitride/oxide layers 22/24/26 (i.e. side walls of trenches 30 include indentations 31). The resulting structure is illustrated in FIG. 2D.

Figure 2E:
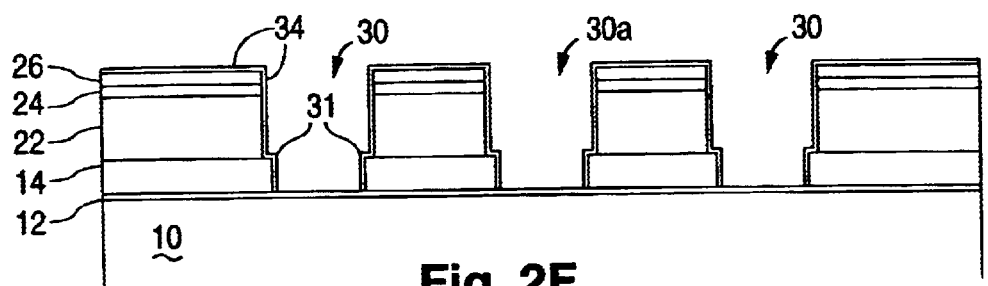
Figure 2F:
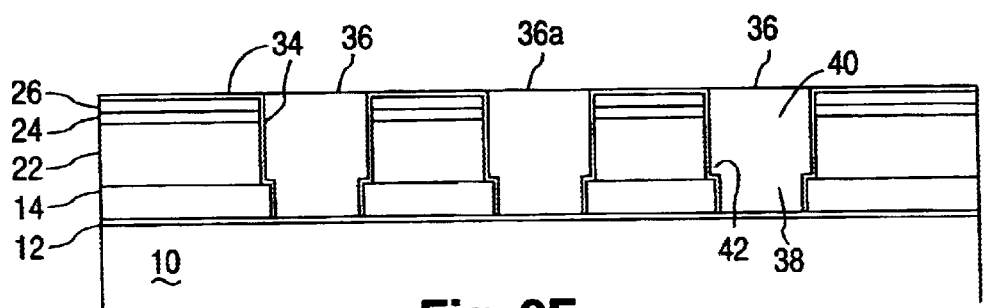

A thin layer of oxide 34 is then formed over the entire structure using, for example, an HTO oxide deposition process, as illustrated in FIG. 2E. A polysilicon deposition step is then performed, which fills each of the first trenches 30 (and 30a) with a block 36 (and 36a) of polysilicon. Excess polysilicon deposited outside first trenches 30 and 30a is etched away, preferably in a CMP etch-back process, leaving the tops of polysilicon blocks 36 and 36a substantially even with the top oxide layer 34, as illustrated in FIG. 2F. Poly blocks 36 and 36a are generally rectangular in shape, but indentations 31 in the side walls of trenches 31 cause the poly blocks 36/36a to have a lower narrower portion 38 that is disposed adjacent to the poly layer 14 (insulated therefrom by oxide layer 34), and an upper wider portion 40 that includes a protruding portion 42 that is disposed over a portion of the adjacent poly layer 14.

Figure 2G:
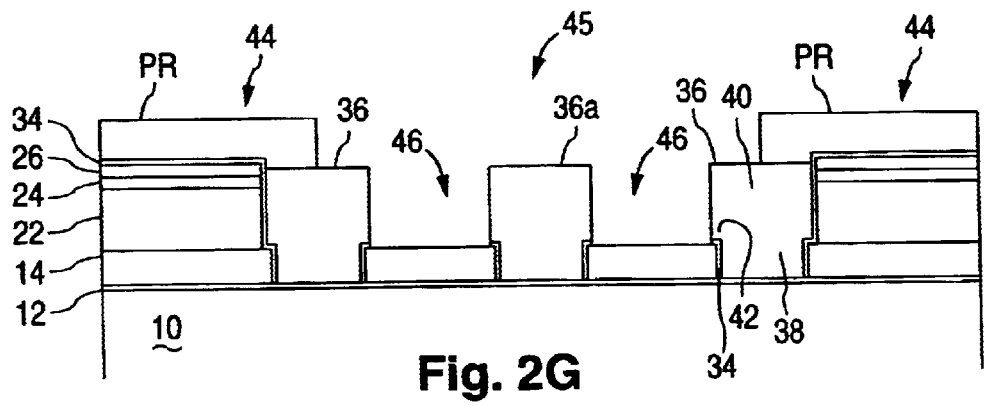

Referring now to FIG. 2G, a nitride and oxide etch mask photo-resist PR (a hard mask could alternatively be used) is placed over the structure to cover alternate intermediate regions 44 (that eventually form the spaces between adjacent mirror sets of memory cells), leaving alternate intermediate regions 45 exposed, and thereby effectively selecting pairs of poly blocks 36 that will be associated together in matching mirror sets of memory cells. The alternate intermediate regions 44 will eventually serve as isolation and bit line connection for the pairs of matching memory cells. It should be noted that the precise location of the photo-resist mask PR is not critical, so long as the edges thereof are located somewhere over the poly blocks 36. An oxide etch process is performed, followed by a nitride etch process (wet or dry), followed by another oxide etch process, to etch away oxide layer 34, oxide layer 26, nitride layer 24, and oxide layer 22 inside the exposed alternate intermediate regions 45 (in-between selected pairs of poly blocks 36). Because the etchant is a selective etchant, the blocks 36 and 36a of polysilicon and the FG poly layer 14 are unaffected, leaving second trenches 46 with the FG poly layer 14 exposed at the bottom thereof. Oxide layer 34 separating poly blocks 36 and poly layer 14 is also intact at the bottom of second trenches 46. For each etch process, the underlying layer acts as an etch stop, and the PR mask prevents any etching in the alternate intermediate regions 44. The resulting structure is shown in FIG. 2G.

Figure 2H:
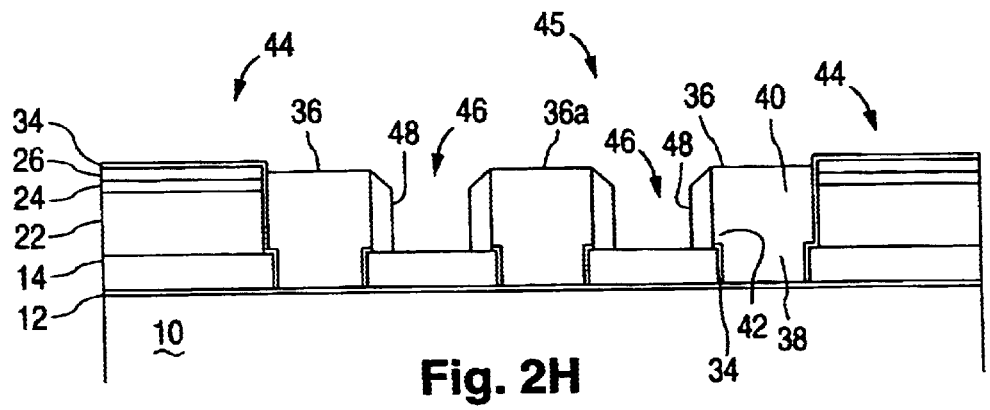

The etch mask PR is then stripped away, followed by the formation of insulation spacers 48 along the side walls of the second trenches 46. The insulation spacers 48 shown in FIG. 2H are preferably formed of nitride, by depositing a thin layer of nitride on exposed surfaces of the structure, followed by an anisotropic etch process, such as Reactive Ion Etch (RIE) which is well known in the art, until the nitride layer is removed except for spacers 48 in second trenches 46. Alternately, a composite spacer 48 can be formed, by depositing a thin layer of nitride, followed by oxide deposition. An isotropic etch is used to form the oxide spacer, followed by a nitride etch, which results in a composite spacer formed of oxide disposed over a thin layer of nitride.

Figure 2I:
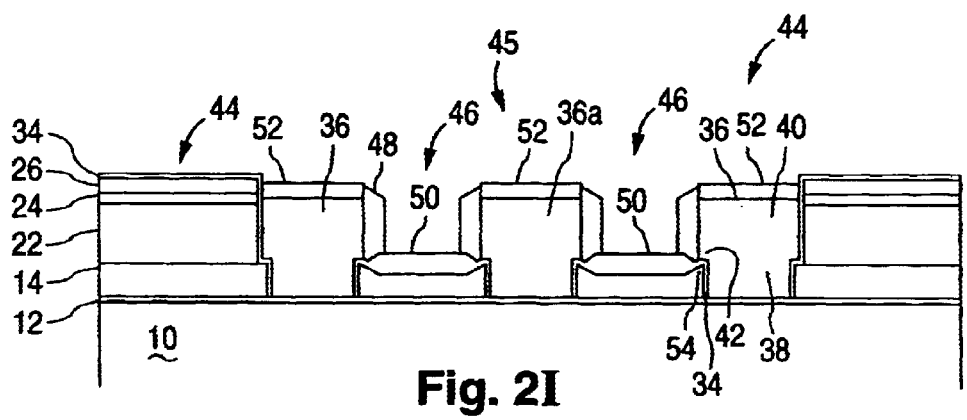

The next step is an oxidation process, which oxidizes the exposed polysilicon surfaces (i.e. polysilicon layer 14 inside of second trenches 46, and top surfaces of polysilicon blocks 36 and 36a) to form an oxide layer 50 over polysilicon layer 14 and another oxide layer 52 over polysilicon blocks 36 and 36a, as illustrated in FIG. 2I. This oxidation step results in oxide layer 50 being formed in a lens shape with side edges thereof joining with oxide layer 34 to form an insulation layer that is disposed adjacent and over the polysilicon layer 14, and in the formation of upwardly projecting sharp edges 54 at each side edge of polysilicon layer 14 located inside second trenches 46. The sharp edges 54 directly facing the protruding portions 42 of poly blocks 36, and the thickness of the insulation layer formed by layers 34/50, permit Fowler-Nordheim tunneling of charges therethrough. While not shown, an optional poly etch process can be performed before the formation of spacer 48 and layer 50. This optional customized anisotropic poly etch process etches away a portion of the top surface of poly layer 14 inside second trenches 46, but leaves a taper shape in that top surface in the area next to poly blocks 36/36a, which helps start the formation of sharp edges 54.

Figure 2J:
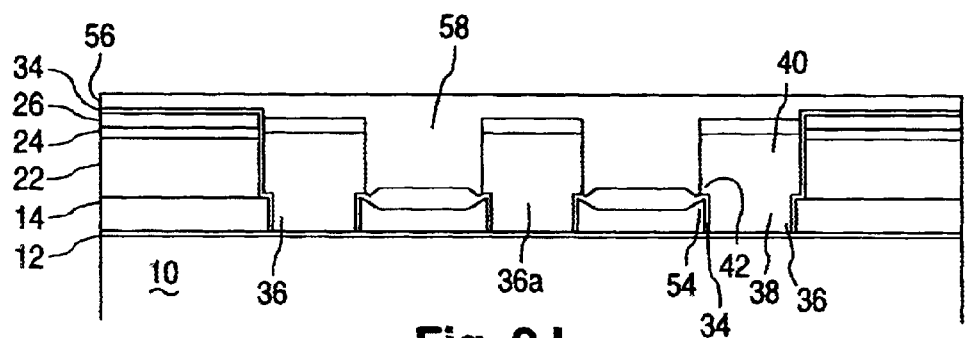

The nitride spacers 48 are then stripped away, preferably using a wet etch process (or other selective isotropic etch process). A deposition of an insulation layer 56 over the entire structure follows, which fills second trenches with blocks 58 of insulation material as well. The dielectric used to form insulation layer 56 shown in FIG. 2J is oxide.

Figure 2K:
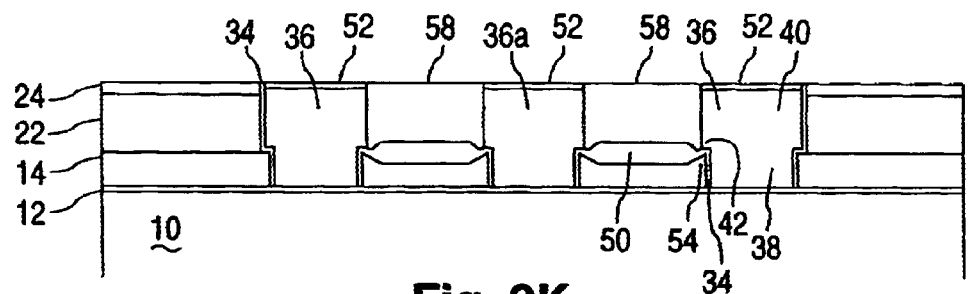

A planarization oxide etch process is performed, preferably in a CMP etch-back process, wherein oxide layers 56, 34 (horizontal portion), and 26 are removed. Nitride layer 24 is used as the oxide etch stopping layer, which leaves a portion of oxide layer 52 over poly blocks 36 and 36a. The resulting structure is illustrated in FIG. 2K.

Figure 2L:
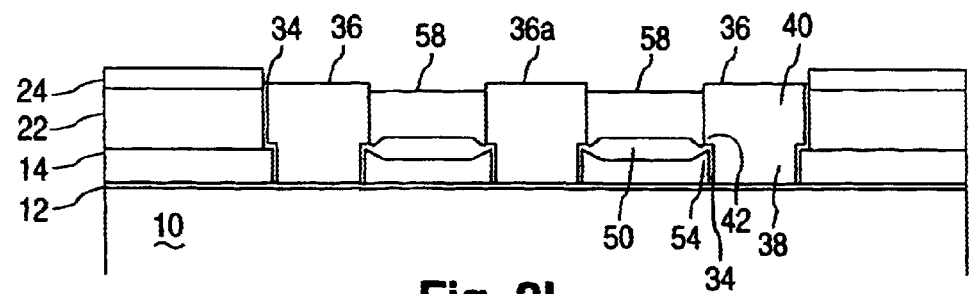

An oxide etch-back step is performed to remove residual oxide from the structure. Specifically, this oxide etch-back step removes oxide layer 52 from the tops of poly blocks 36 and 36a, the top portion of oxide layer 34 between poly blocks 36 and nitride layer 24, and the top portions of oxide blocks 58. The resulting structure is shown in FIG. 2L.

Figure 2M:
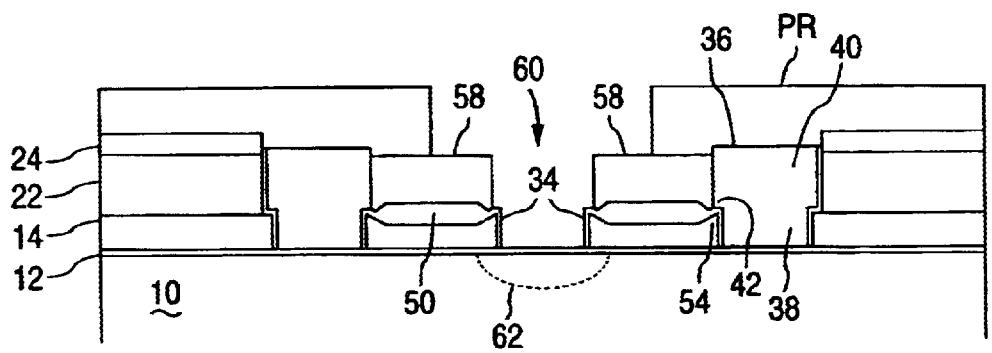

A polysilicon photo-resist etch mask PR is placed over the structure, leaving exposed only the center poly block 36a for each memory cell pair, as illustrated in FIG. 2M. Then, a poly etch process is used to remove the center poly block 36a, forming a trench 60 that extends down to insulation layer 12. Suitable ion implantation is then made across the entire surface of the structure. Where the ions have sufficient energy to penetrate the first silicon dioxide layer 12 in trench 60, they then form a first region (i.e. a second terminal) 62 in the substrate 10. In all other regions, the ions are absorbed by the mask and/or underlying structure, where they have no effect. The resulting structure is illustrated in FIG. 2M.

Figure 2N:
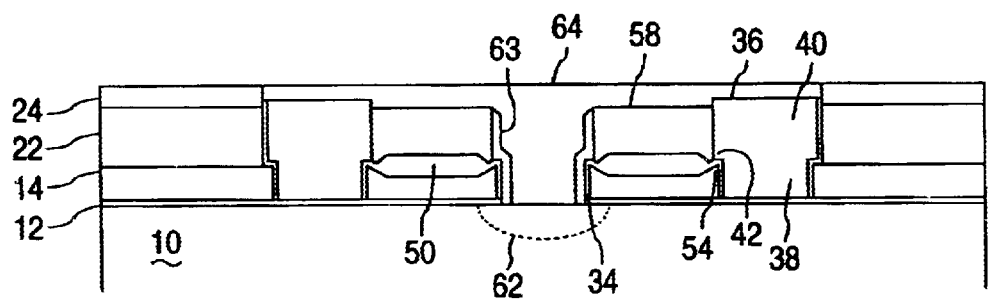

Next, etch mask PR is stripped away, and an insulation spacer 63 is formed on the side walls of trench 60. Preferably insulation spacer 63 is an oxide spacer formed by depositing a thin layer of oxide over the structure, and performing an anisotropic oxide etch to remove the deposited oxide layer except for spacer 63, along with a top portion of oxide blocks 58 and oxide layer 12 at the bottom of trenches 63 to expose the substrate. A polysilicon deposition step follows, with a poly etch-back (preferably CMP) using the nitride layer 24 as an etch stop surface, which fills the trenches 60 with a block 64 of polysilicon that extends over the tops of oxide blocks 58 and poly blocks 36. The polysilicon is properly doped either through an in-situ method or by conventional implantation. The resulting structure is illustrated in FIG. 2N.

Figure 2O:
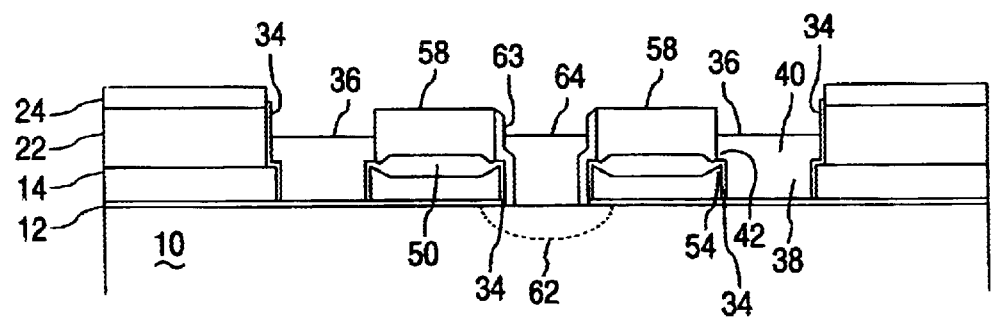

A poly etch-back process is then performed to remove the top portions of poly blocks 36 and 64. Oxide blocks 58 and the top portions of oxide layer 34 are left to extend well above the top surfaces of poly blocks 36/64, as illustrated in FIG. 2O.

Figure 2P:
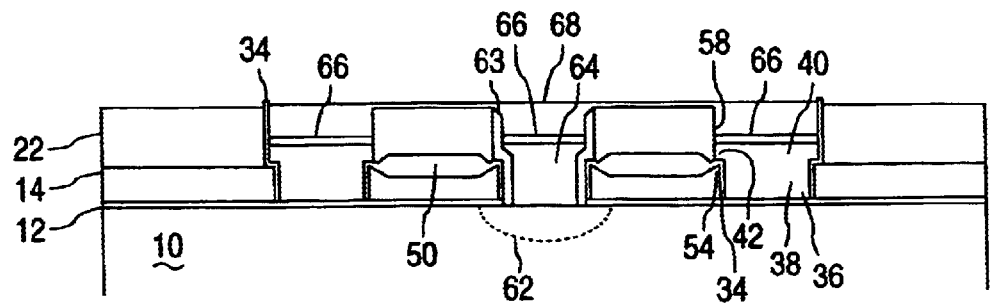

A layer of metalized silicon (polycide) 66 is then formed in the top portions of poly blocks 36 and 64 by depositing a metal such as tungsten, cobalt, titanium, nickel, platinum, or molybdenum over the structure. The structure is then annealed, permitting the hot metal to flow and to seep into the top portions of poly blocks 36/64 to form a conductive layer of polycide 66. The remaining metal deposited on the remaining structure is removed by a metal etch process. A thick layer of nitride 68 is then deposited over the structure, followed by a nitride etch-back process, such as CMP, to remove nitride layer 24 and the top portion of nitride layer 68 so that it is even with oxide layer 22. The resulting structure is illustrated in FIG. 2P.

Figure 2Q:
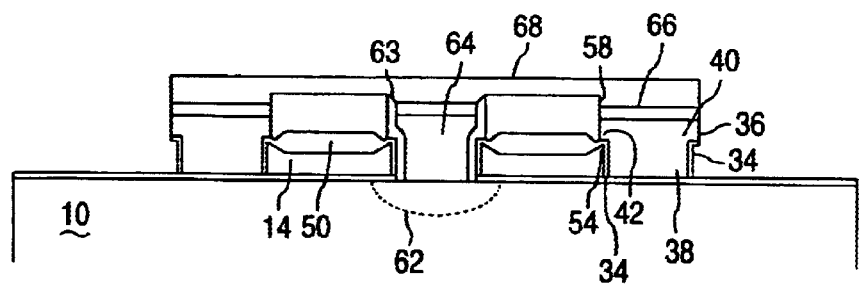

An oxide etch process is used to remove the remaining exposed portions of the oxide layers 22 and 34 from either side of the mirror cell sets to expose polysilicon layer 14 (outside of poly blocks 36), which act as the etch stop. A poly etch process follows to remove the remaining exposed portions of polysilicon layer 14 outside of the pairs of poly blocks 36. The resulting structure is shown in FIG. 2Q.

Figure 2R:
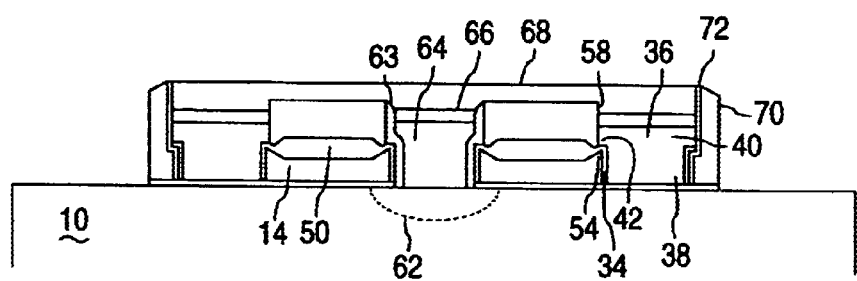

To complete the memory cells, an oxide etch process is then used to remove the remaining exposed portions of oxide layer 12 outside of the pairs of poly blocks 36. Nitride side wall spacers 70 are formed next to poly blocks 36 by first forming a layer of oxide 72 by thermal oxidation or by CVD to cover/e capsulate the poly block 36, which is followed by deposition of nitride over the structure and a anisotropic nitride etch to remove all the nitride except for spacers 70. A thin oxide etch is performed to remove any exposed portions of thin oxide layer 72. The resulting structure is shown in FIG. 2R.

Figure 2S:
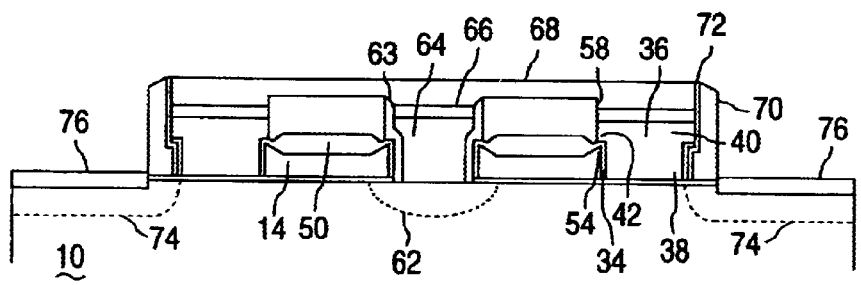

Ion implantation (e.g. N+) is then used to form second regions (i.e. first terminals) 74 in the substrate in the same manner as the first regions 62 were formed. A layer of metalized silicon (silicide) 76 is then formed in the top of the substrate 10 next to side wall spacers 70 by depositing a metal such as tungsten, cobalt, titanium, nickel, platinum, or molybdenum over the structure. The structure is then annealed, permitting the hot metal to flow and to seep into the exposed top portions of the substrate to form a conductive layer of metalized silicon 76. Metalized silicon region 76 on substrate 10 can be called self aligned silicide (i.e. salicide), because it is self aligned to the second regions 74 by spacers 70. The remaining metal deposited on the remaining structure is removed by a metal etch process. The resulting structure is shown in FIG. 2S.

Passivation, such as BPSG 67, is used to cover the entire structure. A masking step is performed to define etching areas over the salicide regions 76. The BPSG 67 is selectively etched in the masked regions to create contact openings that are ideally centered over and wider than the salicide regions 76 formed between adjacent sets of paired memory cells. Nitride layer 68 serves to protect poly blocks 36 and polycide layers 66 from this etch process. The contact openings are then filled with a conductor metal 78 by metal deposition and planarization etch-back, whereby the entire area between spacers 70 of adjacent sets of paired memory cells is filled with the deposited metal to form contact conductors 78 that are self aligned to the salicide regions 76 by the nitride spacers 70 (i.e. self aligned contact scheme, or SAC). The salicide layers 76 facilitate conduction between the conductor 78 and second regions 74. A bit line 82 is added by metal masking over the BPSG 67, to connect together all the conductors 78 in the column of memory cells. The final memory cell structure is illustrated in FIG. 2T.

The self aligned contact scheme (SAC) removes an important constraint on the minimum spacing requirement between adjacent sets of paired memory cells. Specifically, while FIG. 2T illustrates the contact area (and thus conductors 78) perfectly centered over the salicide regions 76, in reality it is very difficult to form the contact openings without some undesirable horizontal shift relative to the salicide regions 76. With a non-self aligned contact scheme, where there is no protective layer of nitride over the structure before BPSG formation, electrical shots can occur if the contact 78 is shifted over and formed over polycide layer 66 and poly block 36. To prevent electrical shorts in a non-self aligned contact scheme, the contact openings would have to be formed sufficiently away from the nitride spacers 70 so that even with the maximum possible shift in the contact regions, they will not extend to nitride spacers 70 or beyond. This of course would present a constraint on the minimum distance between spacers 70, in order to provide a sufficient tolerance distance between adjacent sets of paired mirror cells.

The SAC method of the present invention eliminates this constraint by using the protective layer of material (nitride layer 68) underneath the BPSG. With this protective layer, the contact openings are formed in the BPSG with a sufficient width to ensure there is overlap of the contact opening with the salicide regions 76, even if there is a significant horizontal shift of the contact opening during formation. Nitride layer 68 allows portions of contact 78 to be formed over poly blocks 36 or polycide layer 66, without any shorting therebetween. The wide contact opening guarantees that contacts 78 completely fill the very narrow spaces between spacers 70, and makes good electrical contact with salicide regions 76. Thus, the width of contact regions between spacers 70 can be minimized, while preventing faulty connections by filling the space between spacers 70, allowing the scaling down of the overall cell dimension.

Figure 2U:
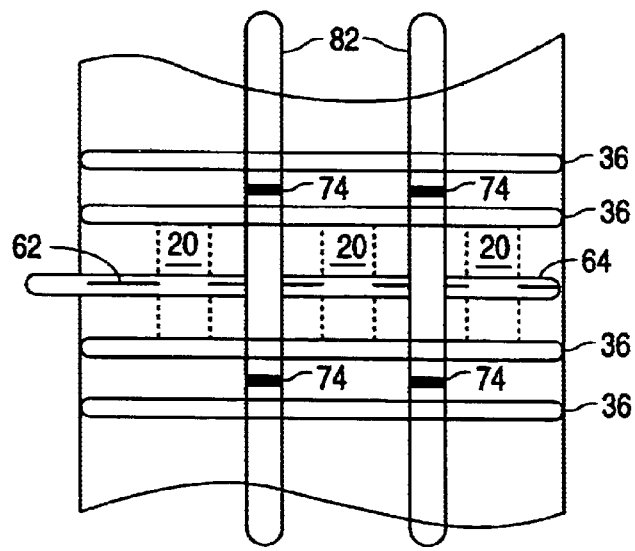
Figure 2T:
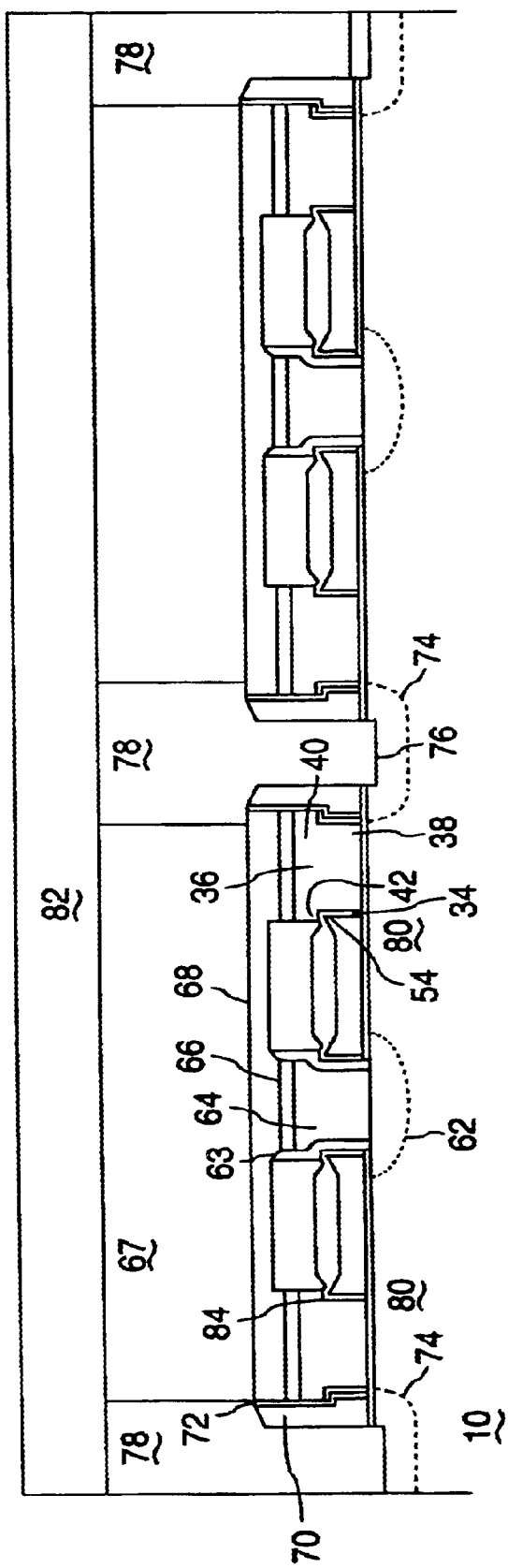

As shown in FIG. 2T, first and second regions 62/74 form the source and drain for each cell (those skilled in the art know that source and drain can be switched during operation). The channel region 80 for each cell is the portion of the substrate that is in-between the source and drain 62/74. Poly blocks 36 constitute the control gate, and poly layer 14 constitutes the floating gate. The control gates 36 have one side aligned to the edge of the second region 74, and are disposed over part of the channel regions 80. Control gates 36 are generally rectangular in shape, but with a lower narrower portion 38 that is disposed adjacent to the floating gate 14 (insulated therefrom by oxide layer 34), and an upper wider portion 40 that includes a protruding portion 42 that is disposed over a portion of the adjacent poly layer 14 (insulated therefrom by oxide layer 50). A notch 84 is formed by the protruding portion 42, where the sharp edge 54 of floating gate 14 extends into the notch 84. Floating gate 14 is over part of the channel region 80, is partially overlapped at one end by the control gate 36, and partially overlaps the first region 62 with its other end. As illustrated in the FIG. 2T, the process of the present invention forms pairs of memory cells that mirror each other. The mirrored memory cells are insulated from each other by oxide layer 72 and nitride spacers 70.

Referring to FIG. 2U, there is shown a top plan view of the resulting structure and the interconnection of the bit lines 82 to the second regions 74 and of the control lines 36 which run in the X or the row direction and finally the source lines 64 which connect to the first regions 62 within the substrate 10. Although the source lines 64 (as should be understood by those skilled in the art, the word "source" is interchangeable with the word "drain") make contact with the substrate 10 in the entire row direction, i.e. contact with the active regions as well as the isolation regions, the source lines 64 electrically connect only to the first regions 62 in the substrate 10. In addition, each first region 62 to which the "source" line 64 is connected is shared between two adjacent memory cells. Similarly, each second region 74 to which the bit line 82 is connected is shared between adjacent memory cells from different mirror sets of memory cells.

The result is a plurality of non volatile memory cells of the split gate type having a floating gate 14, a control gate 36 which is immediately adjacent to but separated from the floating gate 14 and connected to a substantially rectangularly shaped structure which runs along the length of the row direction connecting to the control gates of other memory cells in the same row, a source line 64 which also runs along the row direction, connecting the first regions 62 of pairs of memory cells in the same row direction, and a bit line 82 which runs along the column or Y direction, connecting the second regions 74 of pairs of memory cells in the same column direction. The formation of the control gate, the floating gate, the source line, and the bit line, are all self-aligned. The non-volatile memory cell is of the split gate type having floating gate to control gate tunneling all as described in U.S. Pat. No. 5,572,054, whose disclosure is incorporated herein by reference with regard to the operation of such a non-volatile memory cell and an array formed thereby.

While the floating gate length is still defined by a photolithography step, it is the floating gate poly that is protected by the etching mask, instead of the floating gate poly being exposed to the mask opening. The WL mask defines the word line, floating gate and source dimensions at the same time. In addition, this invention utilizes a self aligned contact scheme to form the bit line 82 contact to the second regions 74.

Figure 3A:
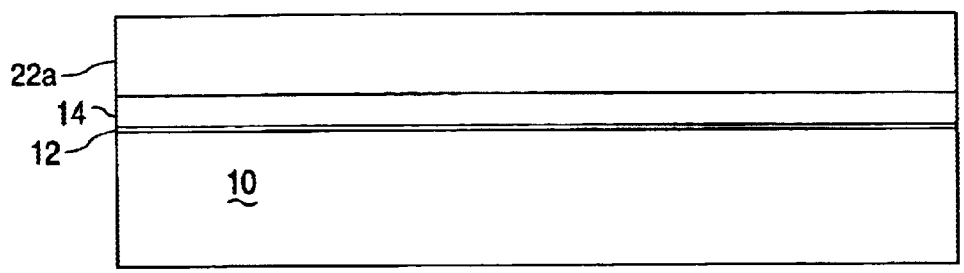
FIGS. 3A–3Q are cross sectional views taken along the line 2—2 of FIG. 1C showing in sequence the steps in a first alternate processing of the structure shown in FIG. 1C, in the formation of a non volatile memory array of floating memory cells of the split gate type.
Figure 3B:
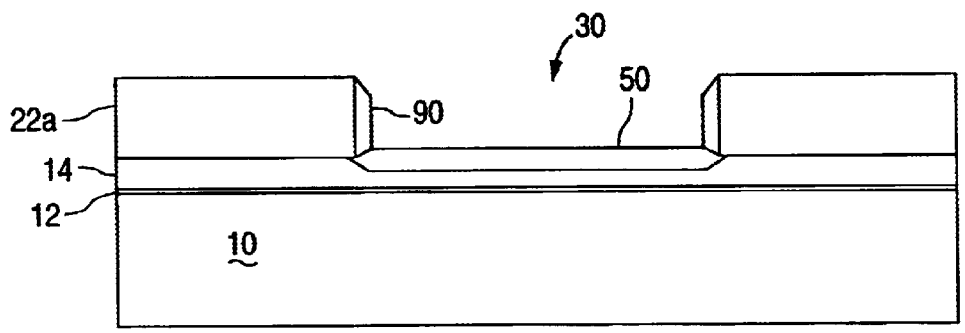

FIGS. 3A–3L illustrate an alternate process for forming a control gate structure similar to that illustrated in FIG. 2T. This alternate process begins with the same structure as shown in FIG. 2A, except that there is only a single insulation layer 22a formed of nitride over the poly layer 14, as illustrated in FIG. 3A. A WL masking operation is performed with photo-resist applied on top of the nitride layer 22a. A masking step is applied in which stripes (i.e. masking regions) are defined in the X or the row direction. The distance between adjacent stripes can be a size determined by the needs of the device to be fabricated. The photo resist is removed in defined masking regions, i.e. stripes in the row direction, after which nitride layer 22a underlying the removed photo resist is etched away in the stripes to expose the underlying poly layer 14. For each such pair of mirror memory cells, this etch process results in the formation of a single first trench 30 that extends down to polysilicon layer 14. The remaining photo-resist is then removed. Insulation spacers 90 are then formed along the side wall surfaces of trenches 30. As stated above, formation of spacers is well known in the art by depositing a material over the contour of a structure, followed by an anisotropic etch process (e.g. RIE), whereby the material is removed from horizontal surfaces of the structure, while the material remains largely intact on vertically oriented surfaces of the structure. Spacers 90 can be formed of any dielectric material. In the structure illustrated in FIG. 3B, insulation spacers 90 are formed of oxide. This is followed by an oxidation process, which oxidizes the exposed portion of polysilicon layer 14 inside of trenches 30 to form a lens shaped oxide layer 50 over polysilicon layer. While not shown, an optional poly etch process can be performed before the formation of spacer 90 and layer 50. This optional customized anisotropic poly etch process etches away a portion of the top surface of poly layer 14, but leaves a taper shape in that top surface in the area next to the remaining nitride layer 22a. The resulting structure is shown in FIG. 3B.

Figure 3C:
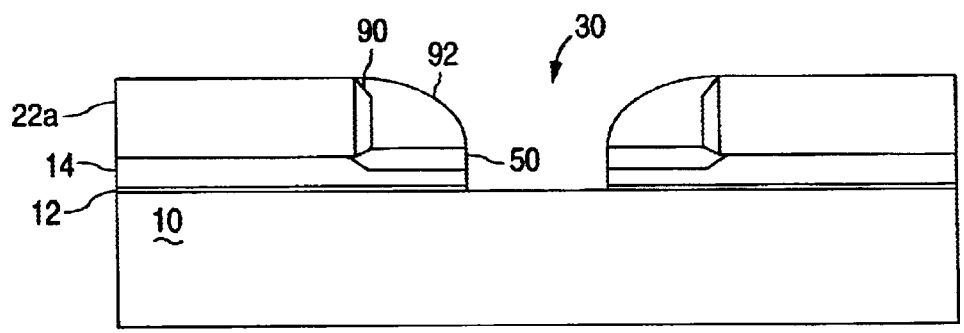

Oxide spacers 92 are then formed inside trenches 30 by depositing a thick layer of oxide, followed by an anisotropic oxide etch, which removes the deposited oxide except for spacers 92. This oxide etch step also removes the center portion of oxide layer 50 from each of the trenches 30. An anisotropic poly etch process is performed between the opposing insulation spacers 92 to remove the exposed poly layer 14 at the bottom of trenches 30 until the oxide layer 12 is observed, which acts as an etch stop. An oxide etch is then performed between spacers 92 to remove the thin oxide layer 12 at the bottom of trenches 30 to expose substrate 10. The use of spacers 92 allows the formation of trenches 30 having a width at the poly layer 14 that is less than the width of the masking step used to initially define the tops of trenches 30. The resulting structure is illustrated in FIG. 3C.

Figure 3D:
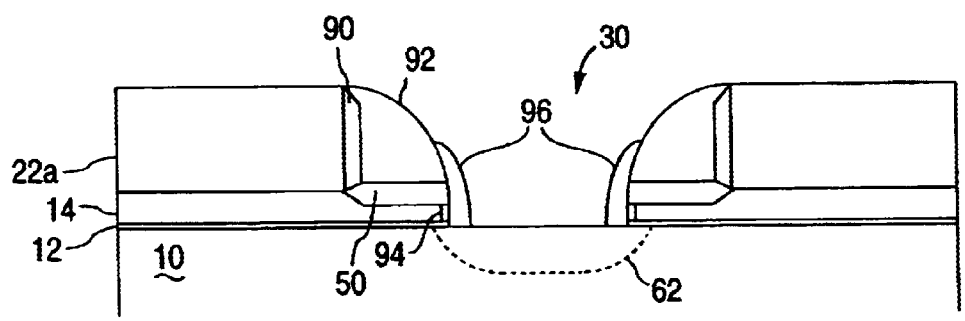

The sides of polysilicon layer 14 and the substrate surfaces that are exposed inside trenches 30 are oxidized in an oxidation step to form FG oxide side walls 94 on the sides of poly layer 14 and to reform oxide layer 12 over the substrate. Suitable ion implantation is then made across the entire surface of the structure. Where the ions have sufficient energy to penetrate the first silicon dioxide layer 12 in trench 30, they then form a first region (i.e. a second terminal) 62 in the substrate 10. In all other regions, the ions are absorbed by the existing structure, where they have no effect. Insulation (e.g. oxide) spacers 96 are then formed inside trenches 30 by depositing a layer of oxide, followed by an anisotropic oxide etch, which removes the deposited oxide except for spacers 96. This oxide etch step also removes the center portion of oxide layer 12 from each of the trenches 30 to expose the substrate 10. The resulting structure is shown in FIG. 3D.

Figure 3E:
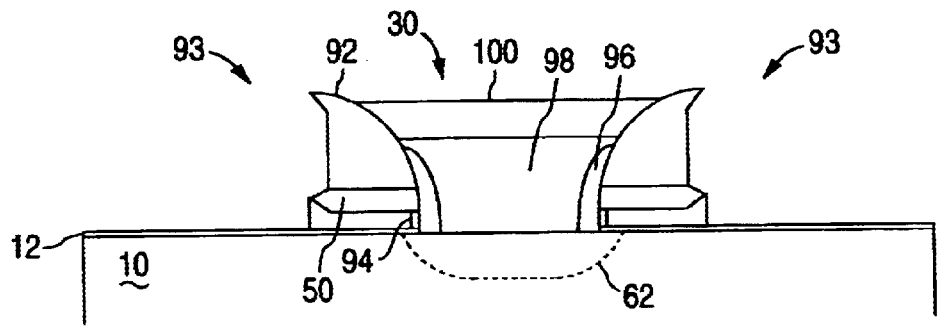

A poly deposition step is then performed, followed by a poly planarization (preferably CMP), to fill trenches 30 with poly blocks 98. A poly etch-back step follows to remove excess polysilicon outside of trenches 30. The polysilicon is properly doped either through an in-situ method or by conventional implantation. An oxide layer 100 is then formed over each of the poly blocks 98 in trenches 30 by depositing a layer of oxide, followed by both CMP and oxide etch-back process which leave oxide layer 100 on poly blocks 98. A nitride etch is then performed to remove nitride layer 22a and nitride spacers 90. An anisotropic poly etch follows to remove the portion of poly layer 14 not covered by oxide spacer 92 and oxide layer 50. The nitride and poly etch steps effectively create second trenches 93, one on either side of the mirror set of memory cells. The resulting structure is shown in FIG. 3E.

Figure 3F:
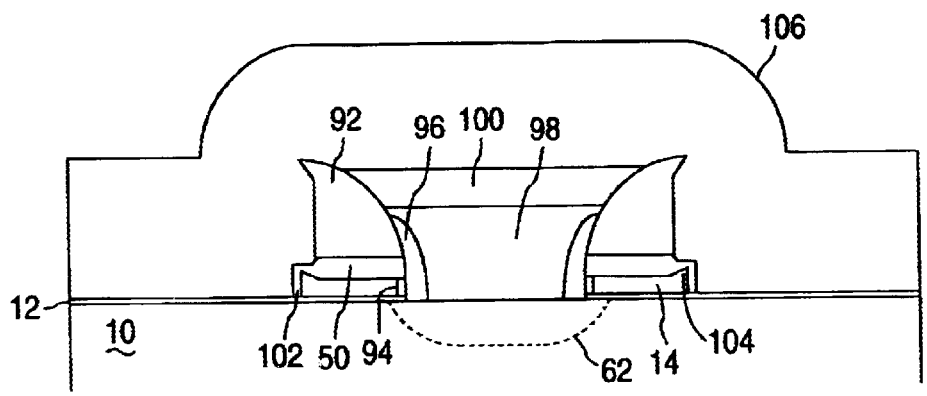

The next step is an oxide formation process, which forms an oxide layer on the exposed ends 102 of poly layer 14 that joins with oxide layer 50 to form an insulation layer that is disposed adjacent and over the polysilicon layer 14, and in the formation of upwardly projecting sharp edges 104 at each side edge 102 of polysilicon layer 14. The sharp edges 104 and the thickness of the insulation layer formed by oxide layers 102/50, permit Fowler-Nordheim tunneling of charges therethrough. The deposition of a thick WL poly layer 106 over the structure follows (filling trenches 93), as illustrated in FIG. 3F.

Figure 3G:
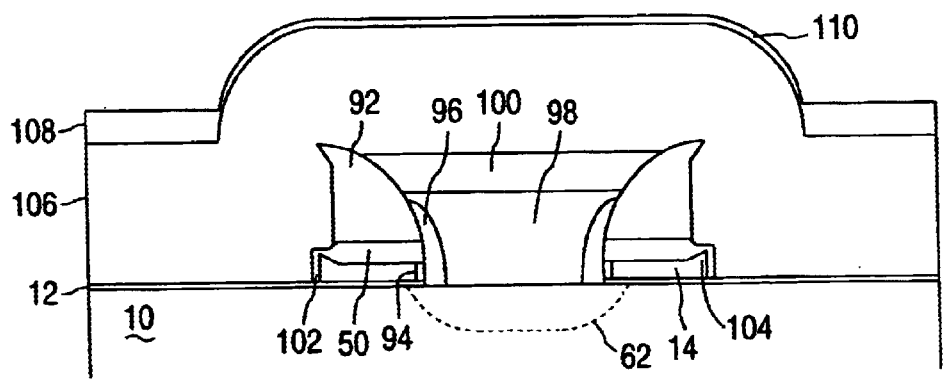
Figure 3H:
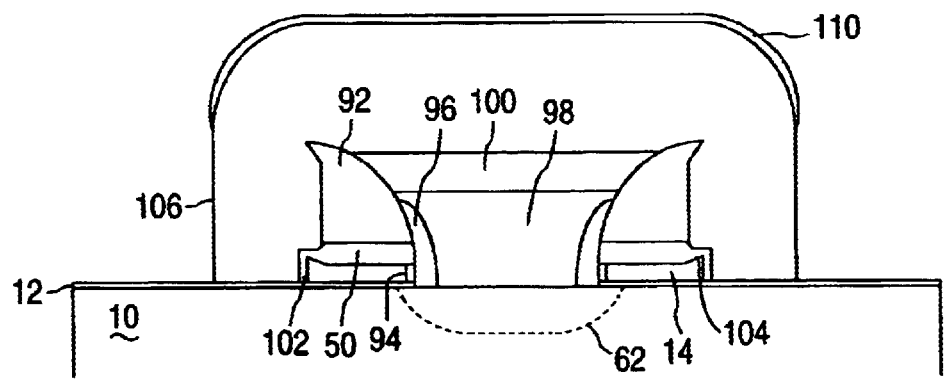
Figure 3I:
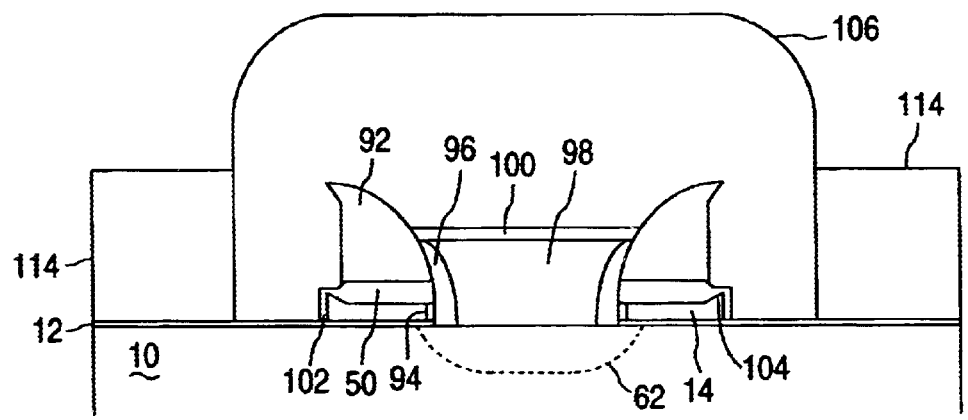

A layer of nitride 108 is then deposited over the structure, followed by a nitride planarization process (e.g. CMP). A nitride etch-back step follows to remove the portion of nitride layer 108 over the raised portion of poly layer 106, while leaving a portion of nitride layer 108 over the flat side portions of poly layer 106. An oxidation step follows, which oxidizes the center portion of poly layer 106 to form a layer of oxide 110 thereover. The resulting structure is shown in FIG. 3G. Nitride layer 108 is removed by a nitride etch process, which is followed by an anisotropic poly etch step to remove those portions of poly layer 106 not directly under oxide layer 110, as illustrated in FIG. 3H.

Figure 3J:
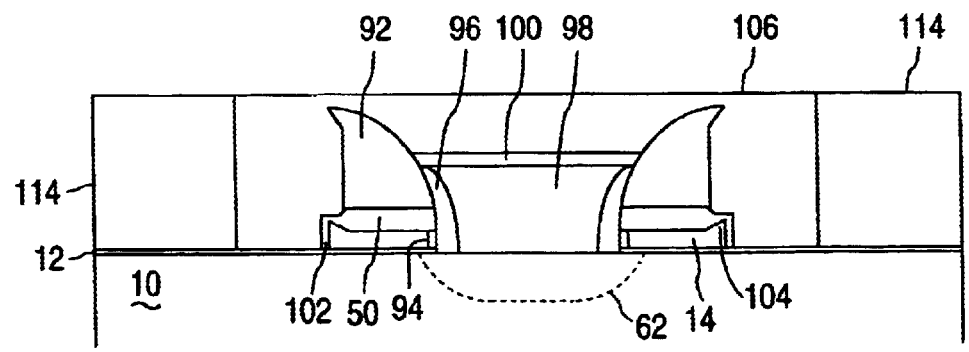
Figure 3K:
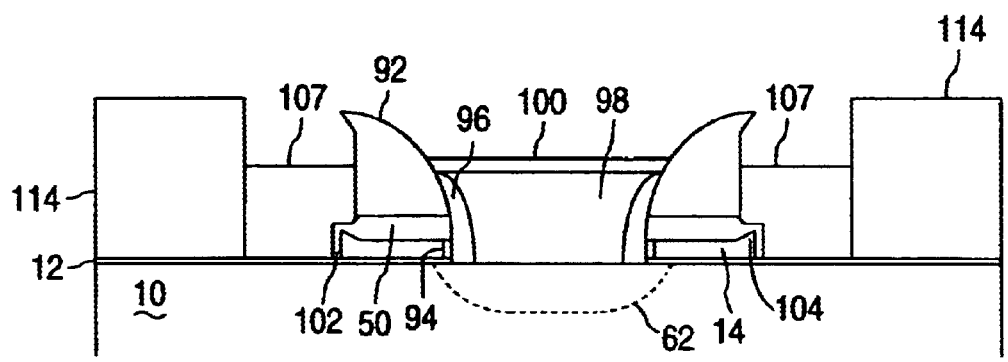

An oxide deposition step is then performed to apply a thick oxide layer 114 over the structure. This is followed by a planarizing oxide etch, such as CMP, to planarize the structure using poly layer 106 as an etch stop. An oxide etch-back step is then performed, leaving blocks 114 of oxide on either side of the poly layer 106. Oxide layer 110 is also removed by the oxide planarizing and etch-back steps, resulting in the structure shown in FIG. 3I. A planarizing poly etch, such as CMP, is then performed using the oxide blocks 114 as an etch stop, as illustrated in FIG. 3J. This is followed by a poly etch-back process, such as RIE, to remove the top portions of poly layer 106 leaving just poly blocks 107 adjacent oxide blocks 114, and exposing oxide layer 100. Oxide blocks 114 and oxide spacers 92 are left to extend well above the top surface of poly blocks 107, as illustrated in FIG. 3K.

Figure 3L:
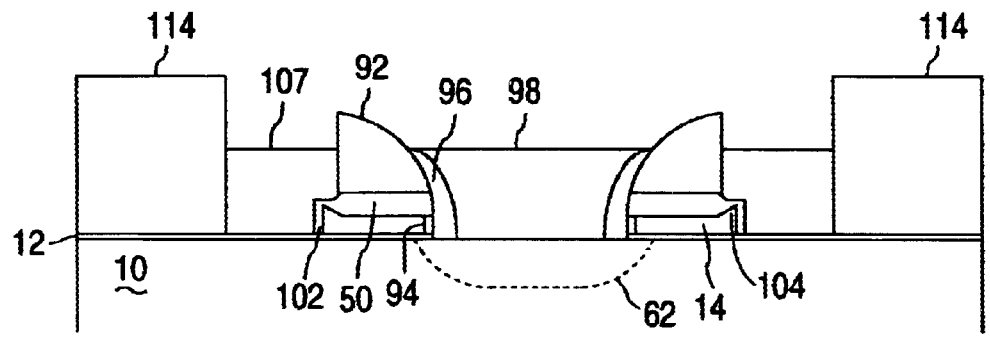
Figure 3M:
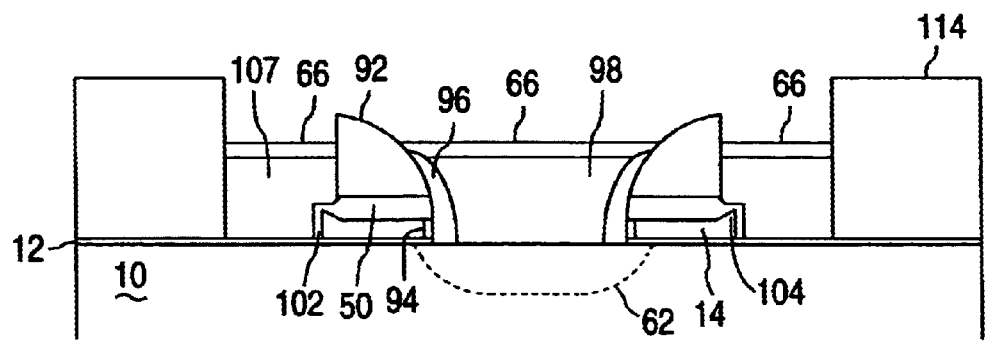

A thin oxide etch step is then performed to remove oxide layer 100 over poly blocks 98. This oxide etch also removes top portions of oxide spacers 92 and oxide blocks 114, as illustrated in FIG. 3L. An optional implant step can be performed to dope the exposed poly blocks 107 and 98. A metal deposition step is then performed, to deposit a metal such as tungsten, cobalt, titanium, nickel, platinum, or molybdenum over the structure. The structure is then annealed, permitting the hot metal to flow and to seep into the exposed top portions of the poly blocks 107 and 98 to form a conductive layer of metalized silicon 66 (i.e. polycide) thereon. The remaining metal deposited on the remaining structure is removed by a metal etch process. Metalized silicon layer 66 can be called self aligned polycide because it is self aligned to the poly blocks 107 and 98 by oxide spacers 92 and oxide blocks 114. The resulting structure is shown in FIG. 3M.

Figure 3N:
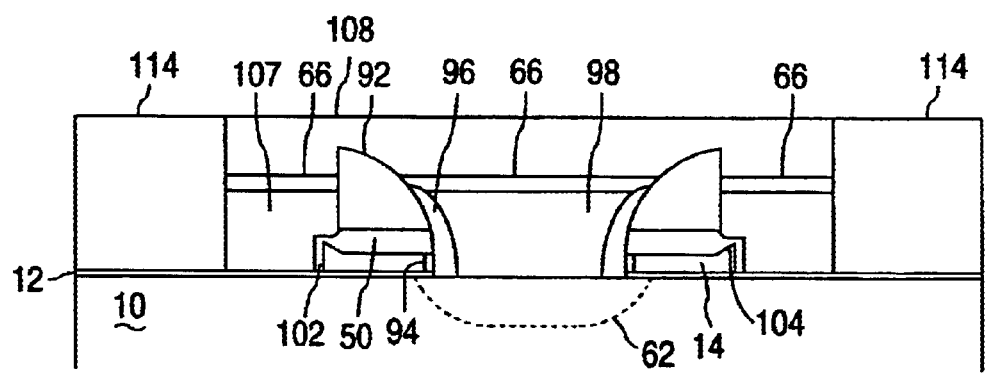
Figure 3O:
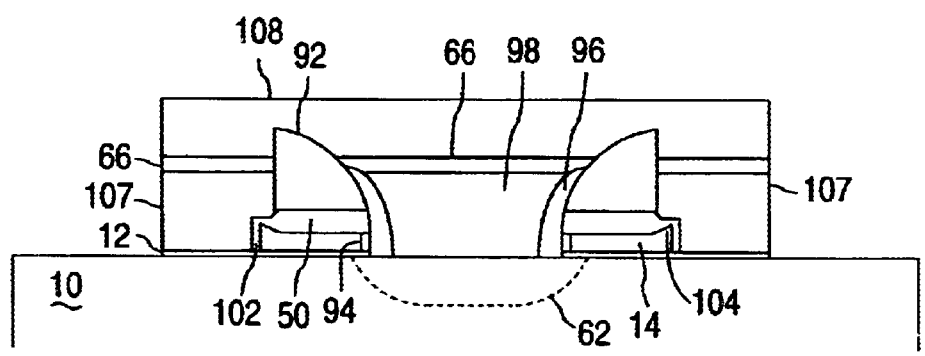

A protective nitride layer 108 is formed between oxide blocks 114 in the following manner. Nitride is deposited over the structure, followed by a planarizing nitride etch, such as CMP, with oxide blocks 114 used as the etching stop layer, so that nitride layer 108 is level with oxide blocks 114, as shown in FIG. 3N. An oxide etch follows to remove oxide blocks 114, and that portion of oxide layer 12 that is not underneath and protected by nitride layer 108 and poly block 107. The resulting structure is shown in FIG. 3O.

Figure 3P:
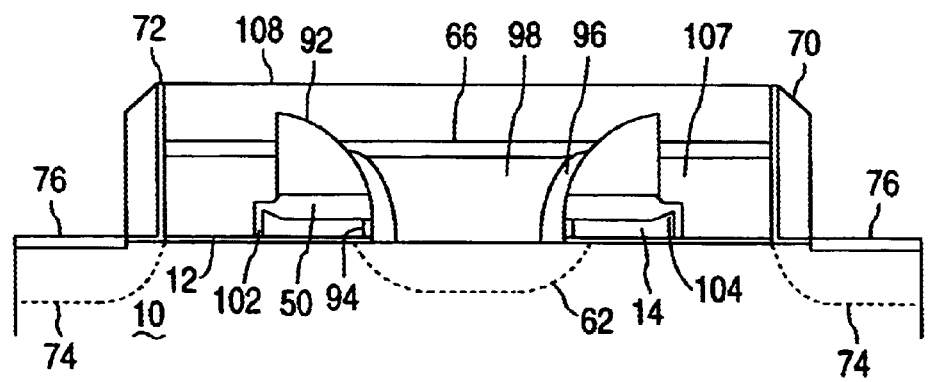

To complete the memory cells, nitride side wall spacers 70 are formed next to poly blocks 107 by first forming a layer of oxide 72 by thermal oxidation or by CVD to cover/encapsulate the poly block 107, which is followed by deposition of nitride over the structure and an anisotropic nitride etch (such as RIE dry etch) to remove all the added nitride except for spacers 70. Oxide layer 72 is used as an etch stop to preserve nitride layer 108. Ion implantation (e.g. N+) is then used to form second regions (i.e. first terminals) 74 in the substrate in the same manner as the first regions 62 were formed. A thin oxide etch is performed to remove any exposed portions of thin oxide layer 72 over substrate 10. A metal deposition step is then performed, to deposit a metal such as tungsten, cobalt, titanium, nickel, platinum, or molybdenum over the structure. The structure is then annealed, permitting the hot metal to flow and to seep into the exposed top portions of the substrate to form a conductive layer of metalized silicon 76 (silicide) on the substrate next side wall spacers 70. Metalized silicon region 76 on substrate 10 can be called self aligned silicide (i.e. salicide), because it is self aligned to the second regions 74 by spacers 70. The remaining metal deposited on the remaining structure is removed by a metal etch process. The resulting structure is shown in FIG. 3P.

Passivation, such as BPSG 67, is used to cover the entire structure. A masking step is performed to define etching areas over the salicide regions 76. The BPSG 67 is selectively etched in the masked regions to create contact openings that are ideally centered over and wider than the salicide regions 76 formed between adjacent sets of paired memory cells. Nitride layer 108 serves to protect poly blocks 107 and polycide layers 66 from this etch process. The contact openings are then filled with a conductor metal 78 by metal deposition and planarizing etch-back, whereby the entire area between nitride spacers 70 of adjacent sets of paired memory cells is filled with the deposited metal to form contact conductors 78 that are self aligned to the salicide regions 76 by the nitride spacers 70 (i.e. self aligned contact scheme, or SAC). The salicide layers 76 facilitate conduction between the conductors 78 and second regions 74. A bit line 82 is added by metal masking over the BPSG 67, to connect together all the conductors 78 in the column of memory cells. The final memory cell structure is illustrated in FIG. 3Q.

The self aligned contact scheme (SAC) removes an important constraint on the minimum spacing requirement between adjacent sets of paired memory cells. Specifically, while FIG. 3Q illustrates the contact area (and thus conductors 78) perfectly centered over the salicide regions 76, in reality it is very difficult to form the contact openings without some undesirable horizontal shift relative to the salicide regions 76. With a non-self aligned contact scheme, where there is no protective layer of nitride over the structure before BPSG formation, electrical shorts can occur if the contact 78 is shifted over and formed over polycide layer 66 and poly block 107. To prevent electrical shorts in a non-self aligned contact scheme, the contact openings would have to be formed sufficiently away from the nitride spacers 70 so that even with the maximum possible shift in the contact regions, they will not extend to nitride spacers 70 or beyond. This of course would present a constraint on the minimum distance between spacers 70, in order to provide a sufficient tolerance distance between adjacent sets of paired mirror cells.

The SAC method of the present invention eliminates this constraint by using the protective layer of material (nitride layer 108) underneath the BPSG. With this protective layer, the contact openings are formed in the BPSG with a sufficient width to ensure there is overlap of the contact opening with the salicide regions 76, even if there is a significant horizontal shift of the contact opening during formation. Nitride layer 108 allows portions of contact 78 to be formed over poly block 107 or polycide layer 66, without any shorting therebetween. The wide contact opening guarantees that contacts 78 completely fill the very narrow spaces between spacers 70, and makes good electrical contact with salicide regions 76. Thus, the width of contact regions between spacers 70 can be minimized, while preventing faulty connections by filling the space between spacers 70, allowing the scaling down of the overall cell dimension.

Figure 3Q:
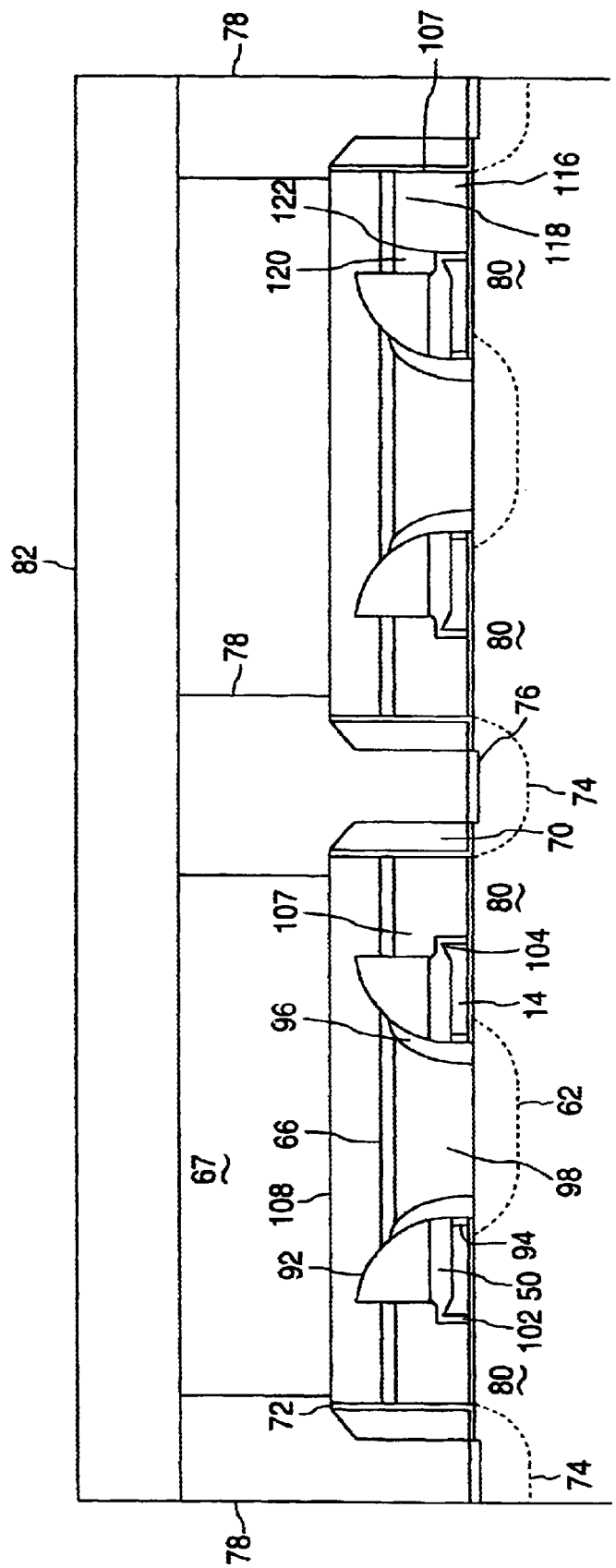

As shown in FIG. 3Q, first and second regions 62/74 form the source and drain for each cell (those skilled in the art know that source and drain can be switched during operation). The channel region 80 for each cell is the portion of the substrate that is in-between the source and drain 62/74. Poly blocks 107 constitute the control gates, and poly layer 14 constitutes the floating gate. The control gates 107 are generally rectangular in shape, but with a lower first portion 116 that is disposed adjacent the floating gate 14 (insulated therefrom by oxide layer 102), and an upper second portion 118 that includes a protruding portion 120 that forms a notch 122 with lower first portion 116, where the sharp edge 104 of floating gate 14 extends into the notch 122. Floating gate 14 is over part of the channel region 80, is partially overlapped at one end by the control gate 107, and partially overlaps the first region 62 with its other end. As illustrated in the FIG. 3Q, the process of the present invention forms pairs of memory cells that mirror each other. Each pair of mirrored memory cells is insulated from adjacent pairs of mirrored memory cells by oxide layers 72 and nitride spacers 70.

This alternate embodiment has the advantage of forming a pair of memory cells based upon the initial formation of a single trench. Further, control gates are substantially rectangularly shaped with a protruding portion 120 over the floating gate 14, and a planar opposing surface that facilitates the formation of planar spacers 70, which in turn facilitates the self aligned formation of the salicide regions 76, and the formation of the self aligned conductor 78.

It is to be understood that the present invention is not limited to the embodiments described above and illustrated herein, but encompasses any and all variations falling within the scope of the appended claims. For example, although the foregoing method describes the use of appropriately doped polysilicon as the conductive material used to form the memory cells, it should be clear to those having ordinary skill in the art that any appropriate conductive material can be used. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention. For example, first trenches 30 and poly blocks 36 and 36a could be formed, with side walls thereof being thereafter etched away, all before poly layer 14 is formed adjacent poly blocks 36/36a. Finally, while poly blocks 36 are shown as symmetrical, the projecting portion 42 that forms notch 84 need only be formed on the side wall of the poly blocks facing floating gate 14 (i.e. at least the side wall of each trench 30 facing the floating gate would include an indentation at a bottom portion of the trench 30).

What is claimed is:

1. An array of electrically programmable and erasable memory devices comprising:
   a substrate of semiconductor material of a first conductivity type;
   spaced apart isolation regions formed on the substrate which are substantially parallel to one another and extend in a first direction, with an active region between each pair of adjacent isolation regions;
   each of the active regions including a column of memory cells extending in the first direction, each of the memory cells including:
   first and second spaced-apart terminals formed in the substrate having a second conductivity type, with a channel region formed in the substrate therebetween,
   a first insulation layer disposed over said substrate including over said channel region,
   an electrically conductive floating gate disposed over said first insulation layer and extending over a portion of said channel region and over a portion of the second terminal, and
   a second insulation layer disposed over and adjacent the floating gate and having a thickness permitting Fowler-Nordheim tunneling of charges therethrough; and
   a plurality of electrically conductive control gates each extending across the active regions and isolation regions in a second direction substantially perpendicular to the first direction and having a first portion that is substantially rectangular in shape and a second portion that is substantially rectangular in shape, the second portion having a width that is greater than that of the first portion, wherein each of the control gates intercepts one of the memory cells in each of the active regions such that the first portion is positioned adjacent to the second insulation layer and the floating gate therein and the second portion partially extends over the second insulation layer and the floating gate.

2. The device of claim 1, wherein the control gate forms a notch at the connection between the first portion and the second portion.

3. An array of electrically programmable and erasable memory devices comprising:
- a substrate of semiconductor material of a first conductivity type;
- spaced apart isolation regions formed on the substrate which are substantially parallel to one another and extend in a first direction, with an active region between each pair of adjacent isolation regions;
- each of the active regions including a column of memory cells extending in the first direction, each of the memory cells including:
  - first and second spaced-apart terminals formed in the substrate having a second conductivity type, with a channel region formed in the substrate therebetween,
  - a first insulation layer disposed over said substrate including over said channel region,
  - an electrically conductive floating gate disposed over said first insulation layer and extending over a portion of said channel region and over a portion of the second terminal, and
  - a second insulation layer disposed over and adjacent the floating gate and having a thickness permitting Fowler-Nordheim tunneling of charges therethrough, and
- a plurality of electrically conductive control gates each extending across the active regions and isolation regions in a second direction substantially perpendicular to the first direction, each of the control gates including a substantially planar side wall portion and a protruding portion that protrudes from the planar side wall portion, wherein each of the control gates intercepts one of the memory cells in each of the active regions such that the substantially planar side wall portion is positioned adjacent to the second insulation layer and the floating gate, and said protruding portion partially extends over the floating gate and is insulated therefrom.

4. The device of claim 3, wherein the control gate forms a notch under the protruding portion.

* * * * *